United States Patent [19]

Wells et al.

[11] Patent Number: 5,515,317

[45] Date of Patent: May 7, 1996

[54] ADDRESSING MODES FOR A DYNAMIC SINGLE BIT PER CELL TO MULTIPLE BIT PER CELL MEMORY

[75] Inventors: Steven E. Wells, Citrus Heights; Kurt B. Robinson, Newcastle, both of Calif.

[73] Assignee: Intel Corporation, Santa Clara, Calif.

[21] Appl. No.: 252,920

[22] Filed: Jun. 2, 1994

[51] Int. Cl.[6] .......................... G11C 11/56; G11C 11/34
[52] U.S. Cl. .............. 395/427; 365/185.03; 365/230.08; 365/185.11; 365/185.21; 365/185.22
[58] Field of Search ..................... 365/184, 185, 365/182, 230.03, 230.08, 900, 230.01; 395/400

[56] References Cited

U.S. PATENT DOCUMENTS

| | | | |
|---|---|---|---|
| 4,202,044 | 5/1980 | Beilstein, Jr. et al. | 365/182 |
| 4,287,570 | 9/1981 | Stark | 365/104 |
| 4,388,702 | 6/1983 | Sheppard | 365/104 |
| 4,415,992 | 11/1983 | Adlhoch | 365/94 |
| 4,586,163 | 4/1986 | Koike | 365/104 |
| 4,653,023 | 3/1987 | Suzuki et al. | 354/104 |
| 4,701,884 | 10/1987 | Aoki et al. | 365/189 |
| 4,709,350 | 11/1987 | Nakagome et al. | 365/184 X |
| 4,771,404 | 9/1988 | Mano et al. | 365/189 |
| 4,964,079 | 10/1990 | Devin | 365/184 X |
| 5,012,448 | 4/1991 | Matsuoka et al. | 365/208 |
| 5,043,940 | 8/1991 | Harari | 365/168 |
| 5,163,021 | 11/1992 | Mehrotra | 365/185 |
| 5,172,338 | 12/1992 | Mehrotra | 365/185 |
| 5,262,984 | 11/1993 | Noguchi et al. | 365/185 |
| 5,297,148 | 3/1994 | Harari | 371/10.2 |
| 5,351,210 | 9/1994 | Saito | 365/189 |

Primary Examiner—David C. Nelms
Assistant Examiner—Huan Hoang
Attorney, Agent, or Firm—Blakely, Sokoloff, Taylor & Zafman

[57] ABSTRACT

A memory system contains memory cells for storing multiple threshold levels to represent storage of "n" bits of data. The memory system includes an address buffer for generating a plurality of physical addresses such that each physical address uniquely identifies a memory location for "j" memory cells. In order to address a portion of the "n" bits identified by a single physical address, the address buffer generates a multi-level cell (MLC) address. The memory system also contains a switch control for permitting selection a multi-level cell (MLC) mode and a standard cell mode. A select circuit permits reading a single bit per cell when the memory operates in the standard cell mode, and permits reading multiple bits of data per memory cell when the memory operates in the multi-level cell mode. The addressing scheme of the present invention maintains address coherency by exhibiting a n:1 correspondence between memory locations and the physical addresses when operating in the MLC mode, and by exhibiting a 1:1 correspondence between memory locations and the physical addresses when operating in the standard cell mode.

26 Claims, 8 Drawing Sheets

ADDRESSING MODES FOR A DYNAMIC SINGLE BIT PER CELL TO MULTIPLE BIT PER CELL MEMORY

FIELD OF THE INVENTION

The present invention relates to addressing memory, and more specifically to addressing a dynamic single bit per cell to multiple bit per cell memory.

BACKGROUND OF THE INVENTION

Memory devices have numerous applications for storing data. Some memory devices store a specific state by altering characteristics pertaining to the threshold of conduction of the device. Typically, in order to program data into the memory device, the threshold of conduction for the memory device is configured such that the conduction of current represents a first state and the non-conduction of current represents a second state. However, such a memory device is configurable to store a range of threshold levels, thereby permitting storage of analog data. The storing of analog data permits storage of multiple bits of data in a single memory cell. This is known as a multi-level cell.

There are prior patents that discuss multi-level storage. U.S. Pat. No. 5,043,940 of Harrari for FLASH EEPROM MEMORY SYSTEMS HAVING MULTISTATE STORAGE CELLS ("Harrari") defines multi-level states in terms of the threshold voltage $V_t$ of a split-channel flash electrically erasable read only memory (EEprom) memory cell. Using these four states, Harrari is able to store two bits of data per memory cell by applying multiple programming pulses to each memory cell. U.S. Pat. No. 5,163,021 of Mehrota et al. for MULTI-STATE EEPROM READ AND WRITE CIRCUITS AND TECHNIQUES ("Mehrota") also describes multilevel memory system. Like Harrari, Mehrota defines four states in terms of memory cell threshold voltage.

However, when storing more than a single bit per cell, the reliability of the memory system is diminished. Therefore, it is desirable to increase the reliability of a memory system capable of storing more than a single bit per cell. The integrity of data storage for some types of data may be increased through the use of error correctional coding. However, other types of data, such as code, are more difficult to encode for operation with an error correction system. Because the integrity of data storage is more critical for some types of data than for others, it is desirable to store some types of data in a low density memory while storing other types of data in a high density memory.

In order to address the additional memory provided by storing more than a single bit per cell, a memory system may add additional high order address bits in the system memory map. Although adding additional high order address bits provides additional address space, it results in non-used segments in the address memory space. Furthermore, adding the additional high order address bits does not provide address coherency between a memory that is capable of storing data in different densities.

SUMMARY AND OBJECTS OF THE INVENTION

Therefore, it is an object of the present invention to store more than a single bit per cell in portions of a memory while storing a single bit per cell in other portions of the memory.

It is another object of the present invention to maintain address coherency in a memory system that stores both a single bit per cell and multiple bits per cell.

It is a further object of the present invention to provide an addressing scheme that is contiguous over an address space in a memory system that stores both a single bit per cell and multiple bits per cell.

These and other objects are realized in a memory system containing a plurality of memory cells for storing one of a plurality of threshold levels in the memory cells. The threshold levels demarcate $2^n$ number of windows for designating states to represent storage of "n" bits of data for the memory cells. The memory system also includes an address buffer for generating a plurality of physical addresses such that each physical address uniquely identifies a memory location for "j" number of the memory cells. In order to address a portion of the "n" bits identified by a physical address, the address buffer generates at least one multi-level cell (MLC) address. In one embodiment, the memory system receives the MLC address from an input pin. In a second embodiment, the memory system includes a multi-level address (MLC) register to receive the MLC address via a command.

The memory system also contains a switch control for permitting selection of an operating mode for the memory system. In one embodiment, at least one multi-level cell (MLC) mode and a standard cell mode are provided. The MLC mode specifies storing more than a single bit of data for each memory cell and the standard cell mode specifies storing a single bit of data for each memory cell. A select circuit permits reading a single bit per cell when the memory operates in the standard cell mode, and permits reading multiple bits of data per memory cell when the memory operates in the multi-level cell mode. The addressing scheme of the present invention maintains address coherency by exhibiting a n:1 correspondence between memory locations and the physical addresses when operating in the MLC mode, and by exhibiting a 1:1 correspondence between memory locations and the physical addresses when operating in the standard cell mode.

Other objects, features and advantages of the present invention will be apparent from the accompanying drawings, and from the detailed description that follows below.

BRIEF DESCRIPTION OF THE DRAWINGS

The objects, features, and advantages of the present invention will be apparent from the following detailed description of the preferred embodiment of the invention with references to the following drawings.

DETAILED DESCRIPTION

The present invention includes an addressing mode for a memory system that is dynamically switchable between a standard cell mode and a multi-level cell (MLC) mode. When operating in the MLC mode, the memory system stores multiple bits per cell. The memory system stores a single bit per cell when operating in the standard cell mode. In one embodiment, the multi-level memory of the present invention stores two bits per cell when operating in the MLC mode. The memory system permits dynamic switching between storing a single bit per cell in portions of the memory and storing multiple bits per cell in other portions of the memory.

Although the present invention is described in conjunction with a memory system storing two bits per cell, any number of bits per cell may be stored in a single cell by increasing the number of threshold levels without deviating from the spirit and scope of the present invention. The addressing scheme of the present invention is described in conjunction with a memory system that is dynamically switchable between a standard cell mode and a multi-level cell (MLC) mode. In addition, a memory system that is dynamically switchable among a plurality of storage modes, such as storing 1 bit per cell, 1.5 bits per cell, 2 bits per cell, etc., may be used without deviating from the spirit and scope of the invention.

As is explained fully below, the addressing scheme of the present invention remains fixed when operating in either the MLC mode or the standard cell mode. In addition, the addressing scheme of the present invention results in no gaps within the address space. Therefore, the addressing scheme provides address coherency between operating in the MLC mode and the standard cell mode.

The address coherency exhibited by the addressing mode permits data structures stored in memory to remain in tact even when switching between operating in the MLC mode and operating in the standard cell mode. For example, compressed and non-compressed data stored in the MLC mode and the standard cell mode may be intermixed. Furthermore, data stored in the standard cell mode is more reliable than data stored in the MLC mode. The addressing scheme of the present invention facilitates implementation of an error correction system on data stored in the MLC mode.

In one system, control structure data, including file system information such as file names, are stored in the standard cell mode. Consequently, storing control structure data in the standard cell mode permits single bit manipulation (e.g. programming of individual cells). For a memory system implemented with flash electrically erasable read only memory (EEPROM), the single bit manipulation allows altering the threshold levels of unprogrammed cells without the need for erasing the corresponding block. The system stores data structures for a user in the MLC mode.

Figure 1:
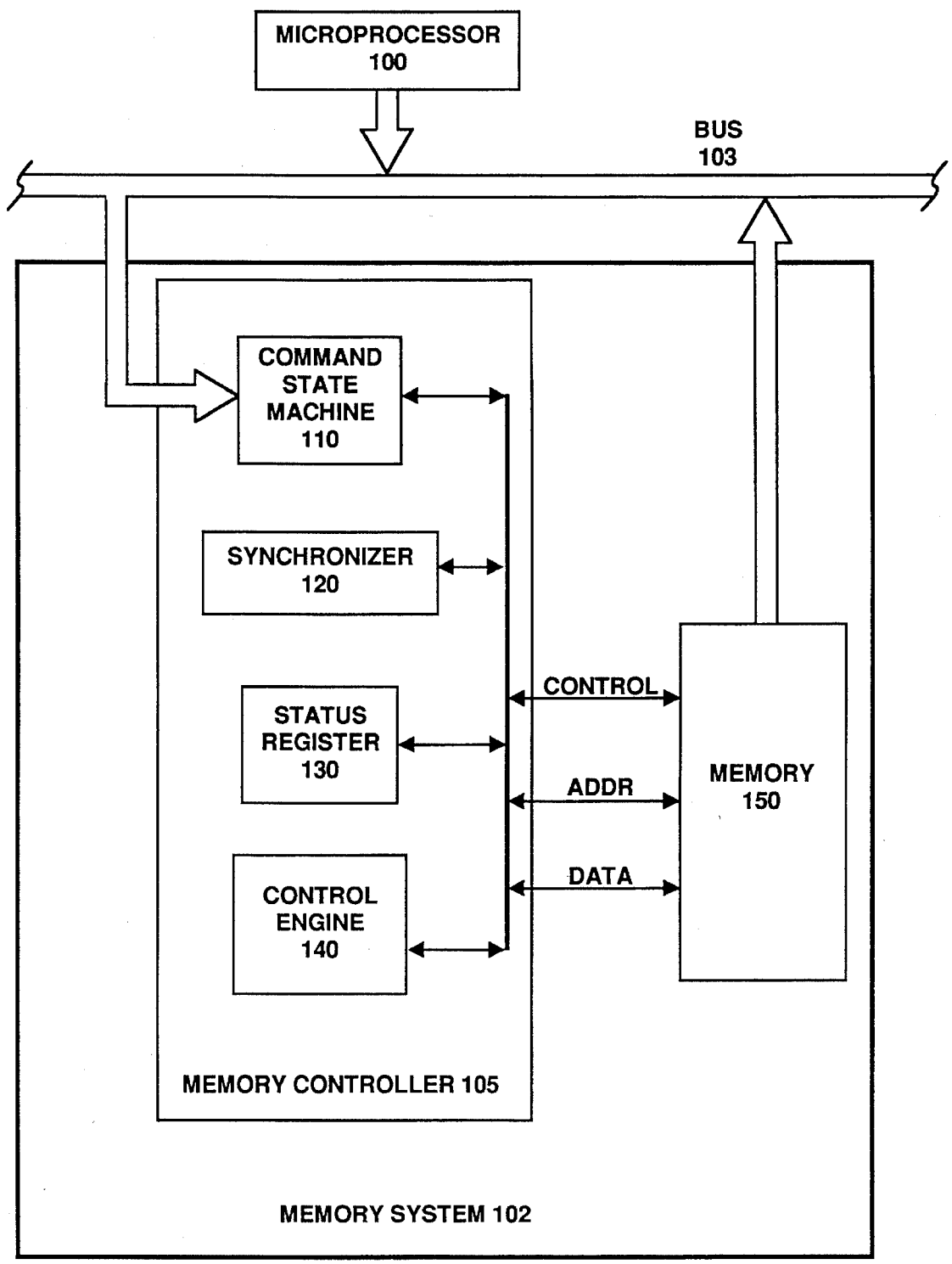
FIG. 1 is a high level block diagram illustrating a memory system and microprocessor.

FIG. 1 illustrates a system block diagram configured in accordance with one embodiment of the present invention. The dynamically switchable memory system has application for use in any system utilizing a multi-level memory, such a computer system. A portion of such a computer system including a microprocessor 100, bus 103 and memory system 102 is shown in FIG. 1. A memory system 102 contains a memory controller 105 and a memory 150. The microprocessor 100 coupled, via the bus 103, to the memory controller 105. The memory controller 105 provides the necessary operations to control the memory 150. In one embodiment, the memory controller 105 and memory 150 are located on a single integrated circuit die. The memory controller 105 contains a command state machine 110, synchronizer 120, status register 130 and a control engine 140. The operations of the memory controller 105 may be executed by the microprocessor 100. The memory 150 contains a memory array as will be described more fully below.

In operation, the microprocessor 100 generates commands to program, erase and read the cells within the memory 150. Through use of the command structure, the microprocessor 100 specifies the type of operation (e.g. read, program/verify, erase/verify), an address specifying the memory cells for the operation, and data for a program/verify operation. The command state machine 110 receives the commands from the microprocessor 100. For a write or program operation, the command state machine 110 directs the control engine 140 to execute a program/verify operation in the memory 150. For a read operation, the command state machine 110 provides the necessary address and control information to the memory 150.

In one embodiment, the control engine 140 comprises a microcontroller that executes micro code stored in a memory. The control engine 140 generates the necessary timing, control, data and addresses for a program/verify operation to the memory 150. The synchronizer 120 permits asynchronous or synchronous operation of the memory 150 with the microprocessor 100. The status register 130 stores status information pertaining to the memory system 102. For a further description of an on-chip program controller, such as memory controller 105, see U.S. patent application Ser. No. 07/655,650, filed Feb. 11, 1991, entitled Flash Memory Erase Suspend and Resume, inventor Fandrich, and assigned to the assignee of the present invention, Intel Corporation, Santa Clara, Calif.

The present invention has application for use in a memory system capable of storing more than a single bit of information in each cell. In one embodiment, the cells of the memory device are constructed as flash electrical erasable programmable read only memory (flash EEprom) cells. Although the present invention is described in conjunction with flash EEprom cells, other cells, such as read only memory (ROM), erasable programmable read only memory (EPROM), conventional electrical erasable programmable read only memory (EEPROM), or dynamic random access memory (DRAM) may be substituted without deviating from the spirit and scope of the invention.

The flash EEprom memory device is organized in blocks of EEprom cells, wherein a particular block is programmed and erased simultaneously. The flash EEprom devices are non-volatile memory devices such that once programmed by a user, the EEprom cells retain the state programmed until erased. In one embodiment, the flash EEprom cells consist of a single transistor having a select gate, a floating gate, a source, and a drain. The source and drain reside on the substrate, and the substrate is grounded. The floating gate is insulated from the select gate and the channel region of the cell by a non-conductive oxide to permit retention of charge on the floating gate.

The flash EEprom memory cell is turned on and off by the absence or presence of charge on the floating gate. During programming, the electrons are placed on the floating gate, and are trapped by surrounding non-conductive oxide. If electrons reside on the floating gate, the field effect generated by the excess electrons results in a high threshold of conductivity for the memory cell. When a voltage is applied to the select gate of such a memory cell, the memory cell is turned off, thereby storing a first logic state. When no excess electrons are trapped on the floating gate, however, the memory cell exhibits a lower threshold of conduction, and the memory cell conducts current to represent a different logic state.

The floating gate can retain a range of charges, and therefore the memory cell can be programmed to exhibit multiple thresholds of conduction or multiple threshold levels ($V_t$). By storing multiple thresholds levels on the floating gate of the cell, the memory cell may be programmed to store more than a single bit. In order to discern the multiple threshold levels, the memory system designates threshold windows. Each threshold window specifies a memory state of the cell. The multiple threshold levels demarcate $2^n$ number of windows for designating states to represent storage of "n" bits of data for the memory cells. The present invention is described in conjunction with a memory cell capable of storing four states to represent two bits. However, the present invention applies to a memory cells storing three or more states.

In order to read the state stored in an addressed flash EEprom memory cell, an operating voltage is placed across the source and drain, and on the control gate to address the cell. The state of the addressed cell is measured by detecting the level of current flowing between the source and drain. The level of current flowing between the source and drain is proportional to the threshold level of the addressed EEprom memory cell. The level of current flowing from the addressed cell is compared against a reference current generated from a reference cell. A sensing scheme for the memory 150 is described more fully below.

As discussed above, a flash EEprom memory cell, as well as other types of memory cells, is configurable to store multiple threshold levels ($V_t$). In a memory cell capable of storing two bits per cell, four threshold levels ($V_t$) are required. Consequently, two bits are designated for each threshold level. Table 1 illustrates logic level designations for four threshold levels ($V_t$) configured in accordance with one embodiment of the present invention.

TABLE 1

| $V_t$ Levels | Logic Level | |
|---|---|---|
| | $Bit_1$ | $Bit_0$ |
| Level 0 | 0 | 0 |
| Level 1 | 1 | 0 |
| Level 2 | 0 | 1 |
| Level 3 | 1 | 1 |

For the threshold levels shown in Table 1, level 0 is the highest threshold level, and level 3 is the lowest threshold level. Although the present invention is described in conjunction with the logic level designations for the threshold levels ($V_t$) as set forth in Table 1, other logic level designations for the $V_t$ threshold levels may be used without deviating from the spirit or scope of the invention.

Table 2 illustrates one addressing scheme for a dynamic single bit per cell to multi-bit per cell memory configured in accordance with the present invention.

TABLE 2

| | Memory Location | |
|---|---|---|
| Address | Standard Mode | MLC Mode |
| Physical $Addr_q$ | Memory $Location_q$ | Memory $Locations_{q \to ((q+1)n-1)}$ |
| . | . | . |
| . | . | . |
| Physical $Addr_2$ | Memory $Location_2$ | Memory $Locations_{2n \to (3n-1)}$ |
| Physical $Addr_1$ | Memory $Location_1$ | Memory $Locations_{n \to (2n-1)}$ |
| Physical $Addr_0$ | Memory $Location_0$ | Memory $Locations_{0 \to (n-1)}$ |

The addressing scheme illustrated in Table 2 provides address coherency between operation in the MLC mode and the standard cell mode. Table 2 generalizes the addressing scheme for a memory capable of storing "q" locations. In the standard cell mode, each addressable memory location may store any number of bits, such as a byte or a word. In the standard cell mode, each physical address, $Addr_0$–$Addr_q$, identifies a unique memory location, memory $location_0$–memory $location_q$, respectively. In order to access the "q" memory locations in the standard cell mode, "q" physical addresses are required. Consequently, in the standard cell mode, the addressing scheme exhibits a 1:1 correspondence between a physical address and a memory location.

For a memory system having memory cells capable of storing "n" bits, each physical address identifies "n" memory locations when operating in the MLC mode. Therefore, in a memory system having "q" physical addresses, "q*n" memory locations are identified in the addressing scheme. For example, when operating in the MLC mode, physical $ADDR_0$ identifies memory $location_0$–memory location(n−1), wherein each memory location may store any number of bits, such as a byte or a word. Consequently, the addressing scheme maintains a n:1 correspondence between memory locations and physical addresses when operating in the MLC mode.

In one embodiment, the memory system stores two bits per cell, and therefore the addressing scheme provides a 2:1 correspondence between memory locations and physical addresses when operating in the MLC mode. If each physical address identifies a word (e.g. 16 bits) for each memory location when operating in the standard cell mode, then each physical address identifies two word (e.g. 32 bits) per memory location when operating in the MLC mode. In order to identify an individual word within the 32 bits, the addressing scheme of the present invention includes a multi-level cell address (MLC addr). In addition, the address scheme includes a byte address to identify a byte within the words for operation in both the MLC and standard cell modes.

Figure 2:
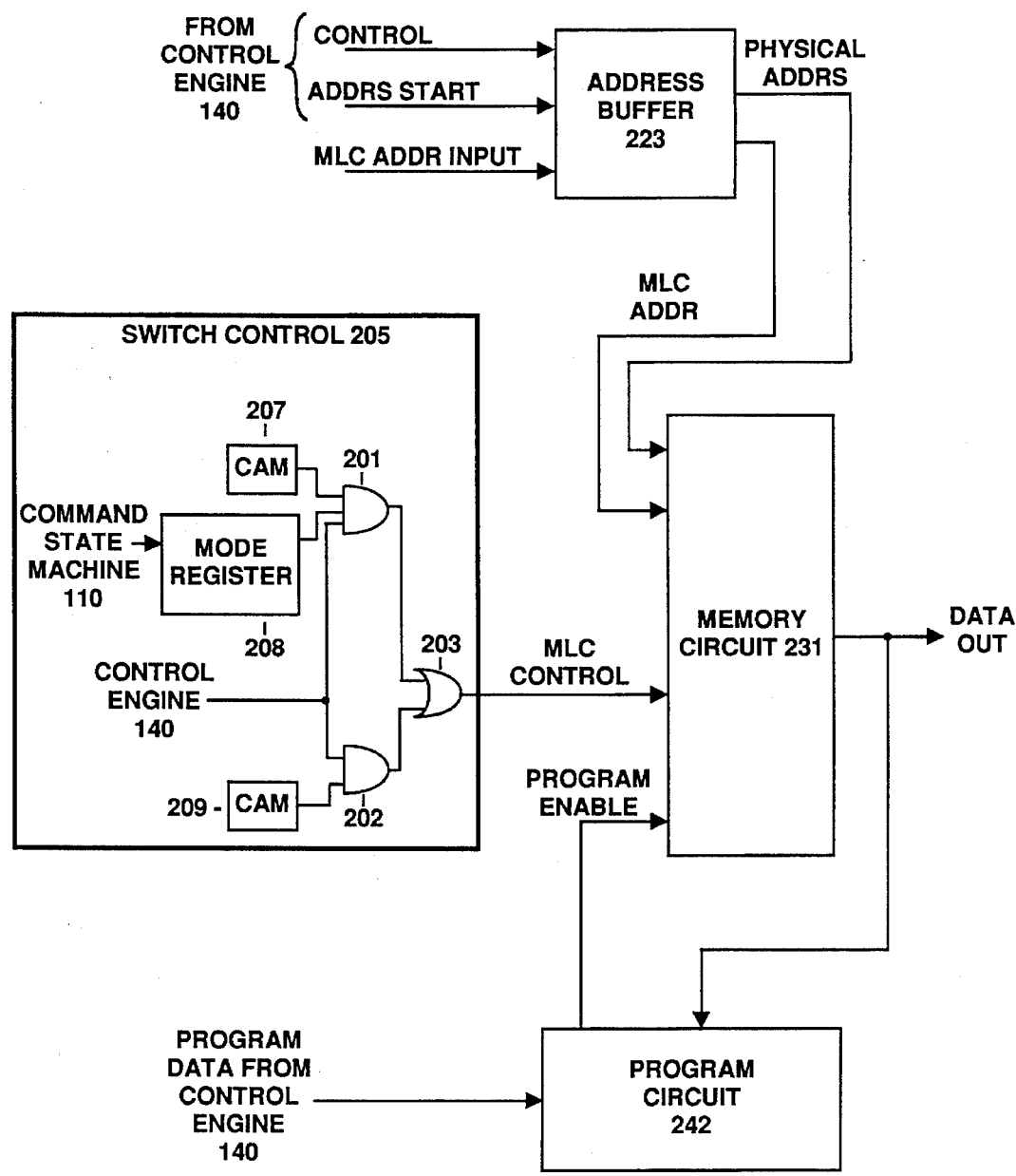
FIG. 2 is a high level block diagram illustrating one embodiment of the memory configured in accordance with the present invention.

FIG. 2 is a high level block diagram illustrating one embodiment of the memory 150. The memory 150 contains a memory circuit 231 and an address buffer 223. The memory 150 also includes a switch control 205 for switching between operation in the MLC mode and the standard cell mode. As is explained more fully below, the memory circuit 231 contains array loads, a plurality of decoders, a memory array, and a sensing system. The address buffer 223 receives, as inputs, control and input addresses and generates, as an output, physical addresses for the memory circuit 231. The switch control 205 generates the MLC control signal for input to the memory circuit 231 to indicate the operating mode for the memory system. Furthermore, the memory 150 contains a program circuit 242. In general, the program circuit 242 programs the memory cells contained within the memory circuit 231 in accordance with selection of the standard cell mode or the MLC mode.

The switch control 205 generates an active MLC control signal to indicate that the memory 150 is operating in the MLC mode. In one embodiment, the switch control 205 contains CAM fuse cells 207 and 209. The CAM cells 207 and 209 are factory programmable. When the CAM cell 209 is programmed or blown, the memory 150 is configured to operate in the MLC mode. The programming of CAM cell 207 permits switching of the memory 150 between the MLC mode and the standard mode via a command. A mode register 208, coupled to the command state machine 110, permits selection between the MLC mode and the standard cell mode through the command control interface.

The switch control 205 also contains AND gates 201, 202, and an OR gate 203. The control engine 140 is coupled to the AND gates 201 and 202 to permit the control engine 140 to override the current selection of the operating mode stored in the mode register 208. The ability for the control engine 140 to control selection of the MLC and standard cell modes is useful in both testing and system applications. For example, during an erase operation, all cells in an erase block are erased to a common state. The control engine 140 may operate more efficiently on cell levels than on a bit basis. Consequently, the switch control 205 generates a MLC control signal via the command state machine 110 or control engine 140 to select operation of the MLC mode or the standard cell mode.

Figure 3A:
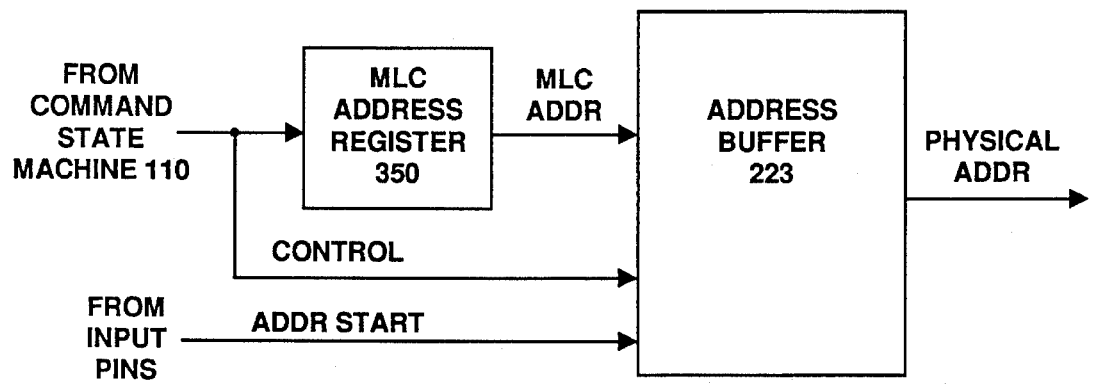
FIG. 3a illustrates a first embodiment for receiving a MLC addr configured in accordance with the present invention.

FIG. 3a illustrates a first embodiment for receiving a MLC addr configured in accordance with the present invention. In the first embodiment, the address buffer 223 is coupled to a multi-level cell (MLC) address register 350. The MLC address register 350 receives the MLC address from the command state machine 110. In addition, the address buffer 223 receives control information from the command state machine 110. A starting address (Addr Start) is input to the address buffer 223. The starting address (Addr Start) is input directly from pins on the memory integrated circuit device.

Figure 3B:
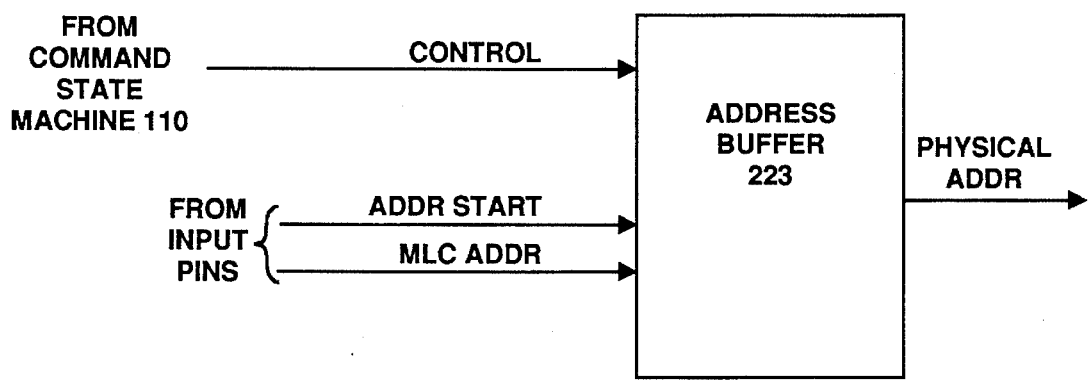
FIG. 3b illustrates a second embodiment for receiving the MLC addr.

FIG. 3b illustrates a second embodiment for receiving the MLC addr. In the second embodiment, the address buffer 223 receives both the starting address (Addr Start) and MLC address (MLC addr) from the input pins of the memory device. Consequently, the MLC address is received directly from an address pin on the memory device. In the second embodiment, the address buffer 223 also receives control information from the command state machine 110.

In a third embodiment, the address buffer 223 receives the MLC addr from both an input pin and the MLC address register 350 depending upon the type of operation being executed. For a read operation, the address buffer 223 receives the MLC address directly from an input pin. For a write operation, the address buffer 223 receives the MLC address from a command via the MLC address register 350.

In operation, the address buffer 223 receives control information, a starting address (Addr Start), and the MLC address. The control information includes the type of operation (read, program/verify, and erase/verify), and a word count. The word count indicates the number of words involved in the corresponding operation. For example, for a command that specifies a read operation and a word count of 256 bytes, the address buffer 223 generates the physical addresses for the read operation for all 256 bytes based on the starting address (Addr Start). In one embodiment, the address buffer 223 is capable of writing 40 bytes of data when operating in the MLC mode.

Figure 4:
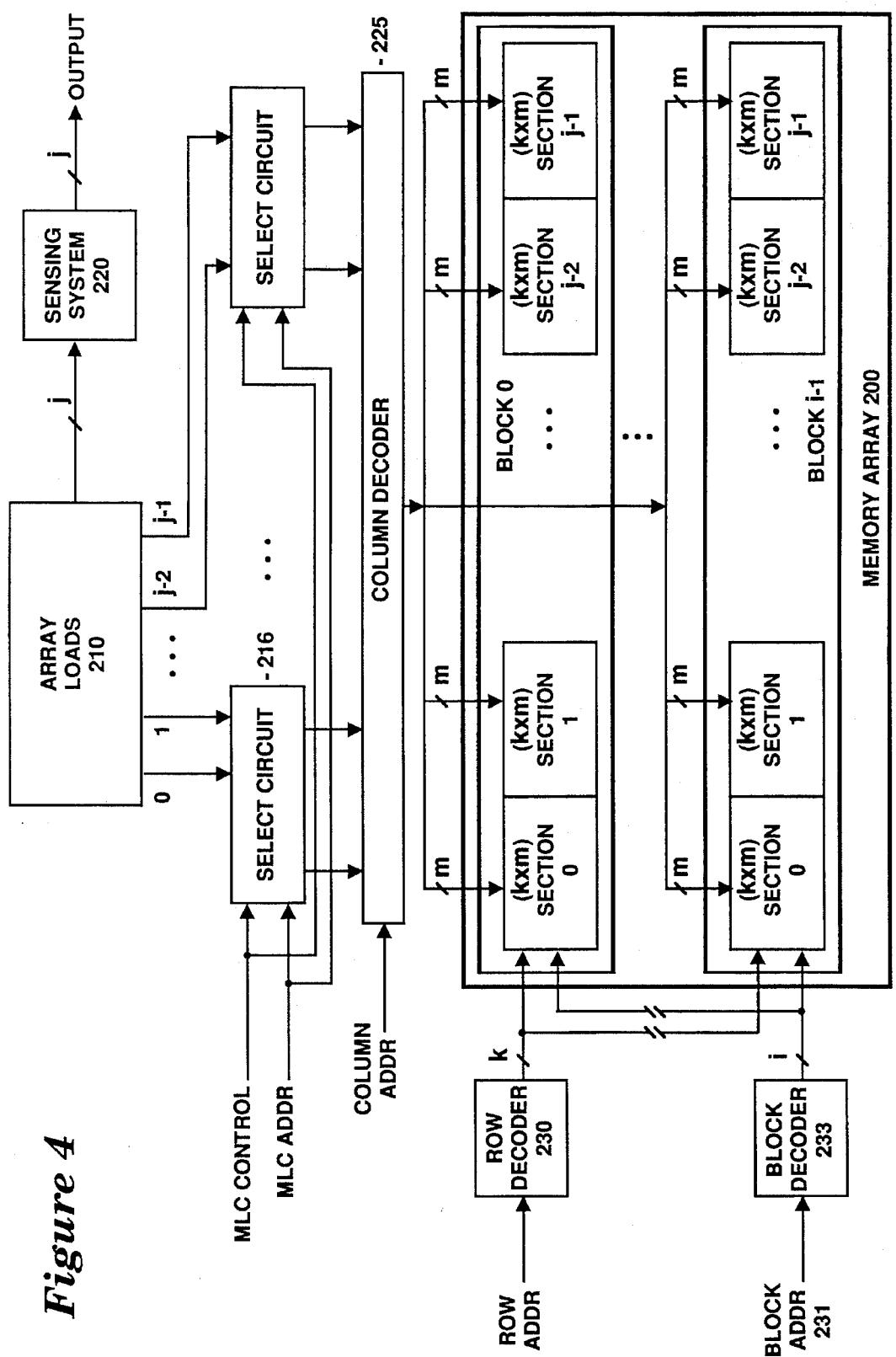
FIG. 4 illustrates a memory circuit configured in accordance with one embodiment of the present invention.

FIG. 4 illustrates the memory circuit 231 configured in accordance with one embodiment of the present invention. The memory circuit 231 contains a plurality of memory cells arranged in a memory array 200. The memory array 200 is arranged in "i" blocks of memory cells. Each memory block comprises "j" sections, wherein each section contains "k" rows or wordlines and "m" columns or bitlines of memory cells. Therefore, each memory block contains (k*m*j) memory cells, and the entire memory array 200 stores (i*k*m*j). The memory circuit 231 outputs "j" bits simultaneously. In order to store data accessible by a unique physical address, one bit of data is stored in each section. In a memory system comprising 16 sections, the memory circuit 231 outputs a 16 bit word.

In one embodiment, each memory block contains 1024 rows, 32 columns, and 16 sections. For this embodiment, each block stores 0.5 megabytes (Mbytes) when operating in the standard cell mode, and each block stores 1 Mbyte when operating in the MLC mode. For a memory array comprising 16 blocks, the memory array stores 2 Mbytes when operating in the standard cell mode, and the memory array stores 4 Mbytes when operating in the MLC mode. However, because the memory of the present invention stores data in both the MLC mode and the standard cell mode, the memory array 200 stores within a range of 2 Mbytes to 4 Mbytes.

Table 3 illustrates an addressing mode for the memory array 200 configured in accordance with one embodiment of the present invention. In order to address the 2 Mbytes of memory in standard mode and the 4 Mbytes in the MLC mode, 22 address bits ($A_0$–$A_{21}$) are utilized. As shown in Table 3, physical address $A_0$ is used to indicate a byte address when the memory system is operating in a byte mode. The physical address $A_1$ is designated as the MLC Addr when operating in the MLC mode. Note that the physical address $A_1$ is not used when the memory system is operating in the standard cell mode. Physical addresses $A_2$–$A_6$ identify a column address, and physical addresses $A_7$–$A_{16}$ identify a row address. Furthermore, physical addresses $A_{17}$–$A_{21}$ identify the block address.

TABLE 3

| Physical Address | Memory Location | |
|---|---|---|
| | MLC Mode | Standard Mode |
| A0 | Byte Addr | Byte Addr |
| A1 | MLC Addr | Don't care |
| A2 | y0 | y0 |
| A3 | y1 | y1 |
| A4 | y2 | y2 |
| A5 | y3 | y3 |
| A6 | y4 | y4 |
| A7 | x0 | x0 |
| A8 | x1 | x1 |
| A9 | x2 | x2 |
| A10 | x3 | x3 |
| A11 | x4 | x4 |
| A12 | x5 | x5 |
| A13 | x6 | x6 |
| A14 | x7 | x7 |
| A15 | x8 | x8 |
| A16 | x9 | x9 |
| A17 | z0 | z0 |
| A18 | z1 | z1 |
| A19 | z2 | z2 |
| A20 | z3 | z3 |
| A21 | z4 | z4 |

In addition to the memory array 200, the memory circuit 231 contains a plurality of column decoders (225), a row decoder 230 and a block decoder 233. For the embodiment illustrated in FIG. 4, each section in the memory array 200 contains a corresponding column decoder 225. The column decoder 225 receives, as inputs, the column address, $A_2$–$A_6$, and couples a output line input from the select circuit 216 to one of "m" column lines in the corresponding section. For the memory array 200 storing 2 Mbytes in the standard cell mode and 4 Mbytes in the MLC mode, each column decoder 225 couples an output line to 16 column lines in each section.

The row decoder 230 receives a row address, $A_7$–$A_{16}$, and selects one of "k" rows based on the row address. For the memory array 200 storing 2 Mbytes in the standard cell mode and 4 Mbytes in the MLC mode, the row decoder 230 selects one of 1024 rows. The block decoder 233 is coupled to each block in the memory array 200 and enables selection of the corresponding word lines and bit lines. The block decoders 233 receive, as inputs, the block address, $A_{17}$–$A_{21}$, and select a block as indicated by the block address. The column decoders 225, row decoder 230, and block decoder 233 are intended to represent a broad category of decoders used to access memory arrays which are well known in the art and will not be described further.

The memory circuit 231 further includes array loads 210, sensing system 220, and select circuits 216. The array loads 210 contain a column load and drain bias for each of "j" output lines in the memory system. Two output lines (an odd and an even output line) from the array loads 210 is input to each select circuit 216. In general, the select circuit 216 couples an odd and even output line from the array loads 210 to the column decoders 225 based the MLC control and MLC address signals. The array loads 210 generate output line voltages, $V_{OL}$, for each output line, in accordance with the level of conductivity exhibited in the addressed cell for that particular output line. The output line voltages are input to the sensing system 220. The sensing system 220 generates output data based on the state of the output line voltages ($V_{OL}$).

Figure 5:
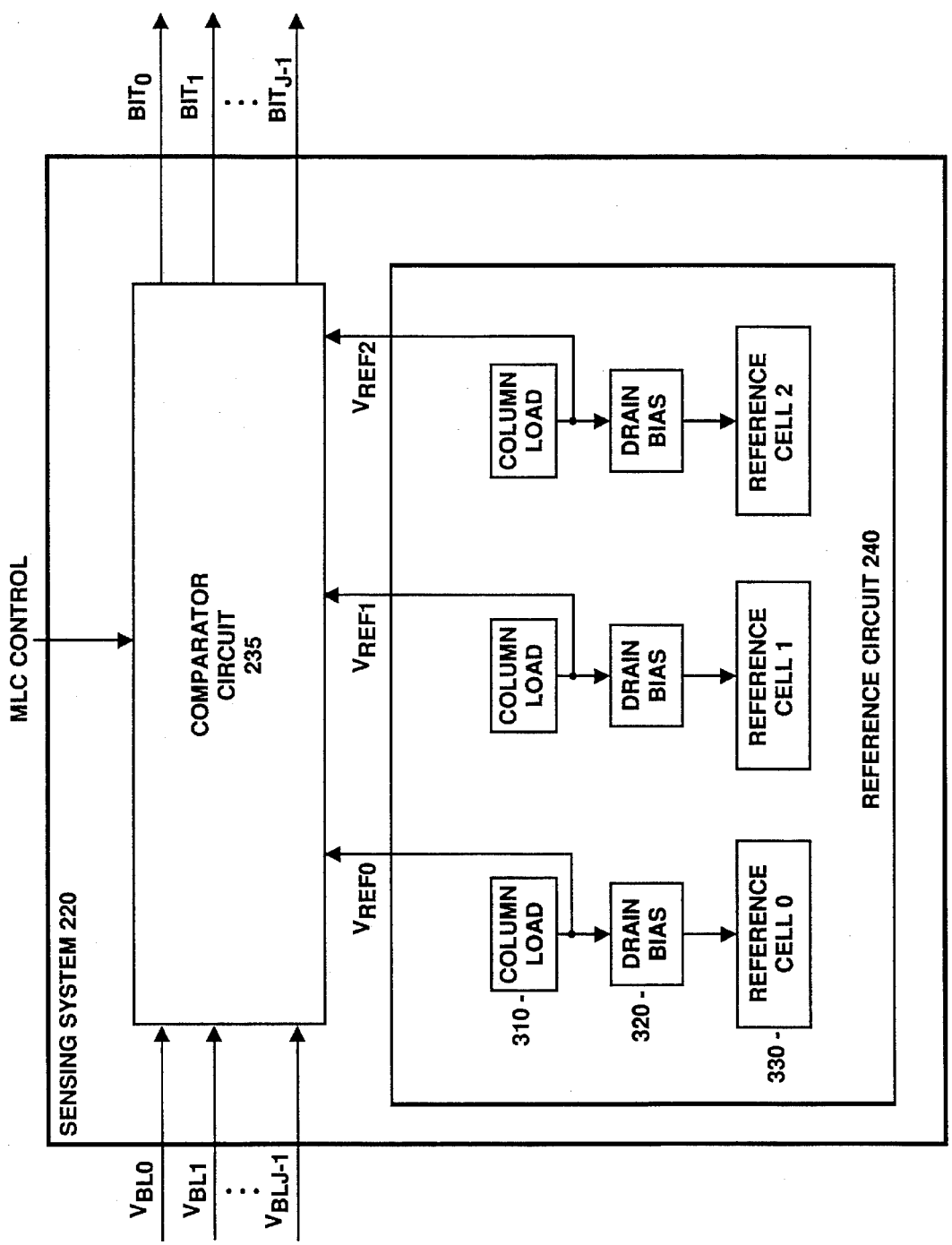
FIG. 5 illustrates a sensing system configured in accordance with one embodiment of the present invention.

FIG. 5 illustrates a sensing system configured in accordance with one embodiment of the present invention. The sensing system 220 contains a reference circuit 240 and a comparator circuit 235. The reference circuit 240 generates a plurality of reference voltages ($V_{ref}$). The comparator circuit 235 receives the output line voltages ($V_{OL}$) generated by the array loads 210, and compares the output line voltages ($V_{OL}$) with the reference voltages ($V_{ref}$) generated from the reference circuit 240. The output of the comparator circuit 235 is the data read from the addressed cells in the memory array 200.

The reference circuit 240 generates a plurality of reference voltages ($V_{ref}$) for use in comparison with the output line voltages ($V_{OL}$). The reference circuit 240 generates "n–1" reference voltages for "n" states or levels stored in the multi-level memory cells. Therefore, in a memory system capable of storing four states to represent 2 bits, the reference circuit 240 generates three voltage levels, $V_{ref0}$, $V_{ref1}$, and $V_{ref2}$. The $V_{ref0}$ voltage delineates between level 0 and level 1, the $V_{ref1}$ voltage delineates between level 1 and level 2, and the $V_{ref2}$ voltage delineates between level 2 and level 3.

In order to generate the reference voltage levels, the reference circuit 240 contains a reference cell 330 for each reference voltage. The reference cells are constructed with one-time trimmable EEPROM cells. Each reference cell 330 includes a corresponding column load 310 and drain bias 20.

The operation of the column load 310 and the drain bias 320 is analogous with the operation of the column load 212 and drain bias 214 contained in the array loads 210. The reference voltages ($V_{ref}$) are equal to a voltage drop across the column load 310 which is proportional to the conduction of current in the corresponding reference cell 330.

Figure 6:
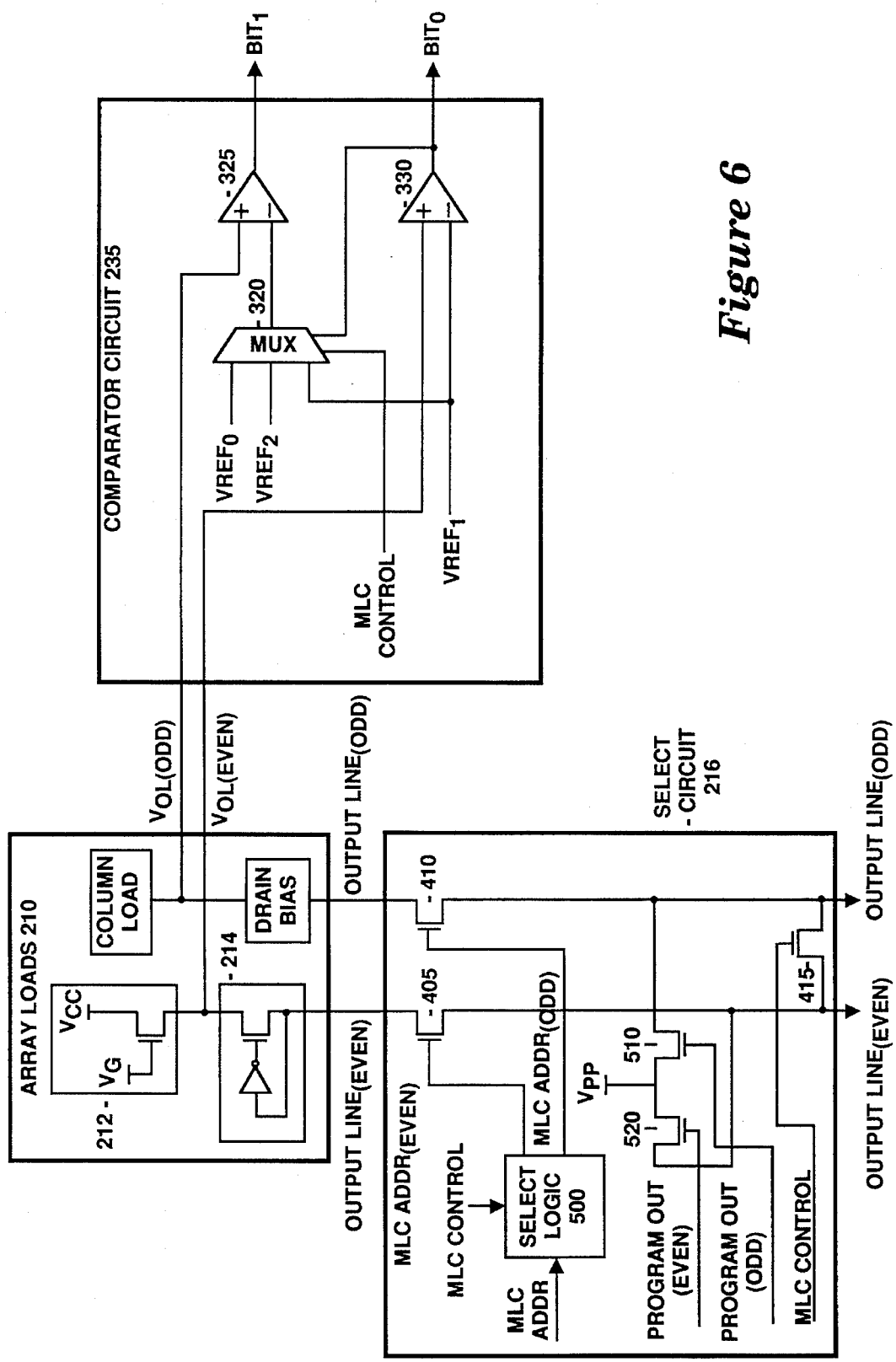
FIG. 6 illustrates a select circuit and a comparator circuit for an odd and even output line configured in accordance with one embodiment of the present invention.

FIG. 6 illustrates the select circuit 216 and the comparator circuit 235 for an odd and even output line configured in accordance with one embodiment of the present invention. Each output line in the array loads 210 contains a column load 212 and a drain bias 214. The column load 212 provides a resistance to generate a voltage, $V_{OL}$, in accordance with the conduction of current in a selected memory cell. In one embodiment, the column load 212 is implemented with a metal oxide field effect transistor (FET). The drain of the column load is coupled to a source voltage, Vcc, and the gate of the column load is coupled to a gate voltage Vg. The gate voltage Vg biases the column load FET to operate in the saturated or pinch-off region. The drain bias 214 biases the corresponding output line to generate the proper drain voltage for the addressed memory cell in the memory array 200. In one embodiment, the drain bias 214 is configured as a cascode circuit.

The array loads 210 also contain a select circuit 216 for every two output lines (e.g. each odd and even output line are input to one select circuit 216). The select circuit 216 receives the MLC control signal, program enable, and the MLC addr. In general, the select circuit 216 connects the column loads 212 and drain biases 214 on the output lines to the selected cells in the memory array 200 to support operation of the memory in both the MLC and standard cell modes. The operation of the select circuit 216 is described more fully below.

As shown in FIG. 6, even and odd output lines are input to the select circuit 216. In order to sense the state of an addressed cell, the select circuit 216 contains a pass transistor for each output line. In one embodiment, the select circuit 216 contains a n-channel field effect transistor (FET) 405 to control conduction of current in the even output line, and a n-channel FET 410 to control conduction of current in the odd output line. The select circuit 216 also contains a n-channel FET 415. The transistor 415 couples the odd output line to the even output line, and the gate of transistor 415 is coupled to the MLC control signal.

The select circuit 216 includes select logic 500. The select logic 500 receives, as inputs, the MLC control and MLC addr signals and generates, as outputs, an MLC $addr_{(even)}$ signal and an MLC $addr_{(odd)}$ signal. The MLC $addr_{(even)}$ signal is coupled to the gate of transistor 405, and the MLC $addr_{(odd)}$ signal is coupled to the gate of transistor 410. Table 4 illustrates a truth table for the select logic 500.

TABLE 4

| Input | | Output | |
|---|---|---|---|
| MLC ADDR | MLC CONTROL | MLC (even) | MLC (odd) |
| — | 0 | 1 | 1 |
| 0 | 1 | 1 | 0 |
| 1 | 1 | 0 | 1 |

When operating in the MLC mode as indicated by a high logic level on the MLC control signal, the select logic 500 sets the MLC $addr_{(even)}$ and MLC $addr_{(odd)}$ signals based on the state of the MLC addr (e.g. a high logic level selects the odd output line and a low logic level selects the even output line). When operating in the standard cell mode as indicated by a low logic level on the MLC control signal, the select logic 500 sets both the MLC addr$_{(even)}$ and MLC addr$_{(odd)}$ signals to a high logic level.

In order to sense an addressed cell in the memory system when operating in the MLC mode, the MLC control signal biases transistor 415 to electrically couple the even output line to the odd output line. The MLC address selects either the even output line or the odd output line, thereby electrically coupling the comparator circuit 235 to the selected odd or even memory cell. When operating in the MLC mode, either the odd or the even memory cell is coupled to both of the odd and even output lines based on the MLC address. In standard cell mode, the MLC control turns off the transistor 415. Consequently, the even memory cell is electrically coupled to the comparator circuit 235 via the even output line, and the odd memory cell is electrically coupled to the comparator circuit 235 via the odd output line.

For each odd and even output line, the comparator circuit 235 contains two comparators, comparators 325 and 330, and a multiplexer (MUX) 320. The comparator 330 receives, as inputs, the even output line voltage, $V_{OLe}$, and the $V_{ref1}$ voltage reference for comparison. The output of the comparator 330 is designated as $BIT_0$. For a memory array capable of storing four states per memory cell, the MUX 320 receives as inputs the voltage references generated from the reference circuit 240 (e.g. $V_{ref0}$, $V_{ref1}$, and $V_{ref2}$). The MUX 320 outputs a reference voltage $V_{ref0}$, $V_{ref1}$, or $V_{ref2}$, based on the state of the MLC control and the output of comparator 330. The comparator 325 receives, as inputs, the odd output line voltage, $V_{OLo}$, and the selected voltage reference (e.g. $V_{ref0}$, $V_{ref1}$, and $V_{ref2}$) for comparison. The output of the comparator 325 is designated as $BIT_1$.

When operating in the MLC mode, the even output line is coupled to the odd output line (e.g. the $V_{OLe}$ voltage level is equal to the $V_{OLo}$ voltage level). If the $V_{OLe}$ voltage level generated by the selected cell is greater than the $V_{ref1}$ voltage level, then a "1" or high logic level is output from the comparator 330. Alternatively, if the $V_{OLe}$ voltage level is less than the $V_{ref1}$ voltage level, then a "0" or low logic level is output from the comparator 330. The output of the comparator 330 and the MLC control signals are utilized as the select for the MUX 320. If the output of the comparator 330 is a low logic level and the MLC control is active high indicating the memory is operating in the MLC mode, then the $V_{ref0}$ voltage level is selected for comparison with the $V_{OLo}$.

If the $V_{OLo}$ voltage level is greater than the $V_{ref0}$ voltage level, then the output of comparator 325 is a high logic level. Alternatively, if the $V_{OLo}$ voltage level is less than the $V_{ref0}$ voltage level, then the output of comparator 325 is a low logic level. If the output of comparator 330 is a high logic level and the MLC control signal is active, then the $V_{ref2}$ voltage level is selected for comparison against the $V_{OLo}$. If the $V_{OLo}$ voltage level is less than the $V_{ref2}$ voltage level, then the output of comparator 325 is a low logic level. Alternatively, if the $V_{OLo}$ voltage level is greater than the $V_{ref2}$ voltage level, then the output of comparator 325 is a high logic level. When operating in the MLC mode, the $BIT_0$ and $BIT_1$ bits represent the state of a single cell.

If the memory system 102 is operating in the standard cell mode, then the $V_{OLe}$ voltage level on the even output line is generated from the selected even memory cell, and the $V_{OLo}$ voltage level on the odd output line is generated from the selected odd memory cell. An inactive MLC control signal selects the $V_{ref1}$ voltage level at MUX 320 for input to the comparator 325. In this way, the $V_{OLe}$ voltage level is compared against the $V_{ref1}$ voltage level in comparator 330, and the $V_{OLo}$ voltage level is compared against the $V_{ref1}$ voltage level in comparator 325. Therefore, the output of comparator circuit 235 represents two bits, wherein the first bit is read from the selected even memory cell, and the second bit is read from the selected odd memory cell.

Figure 7:
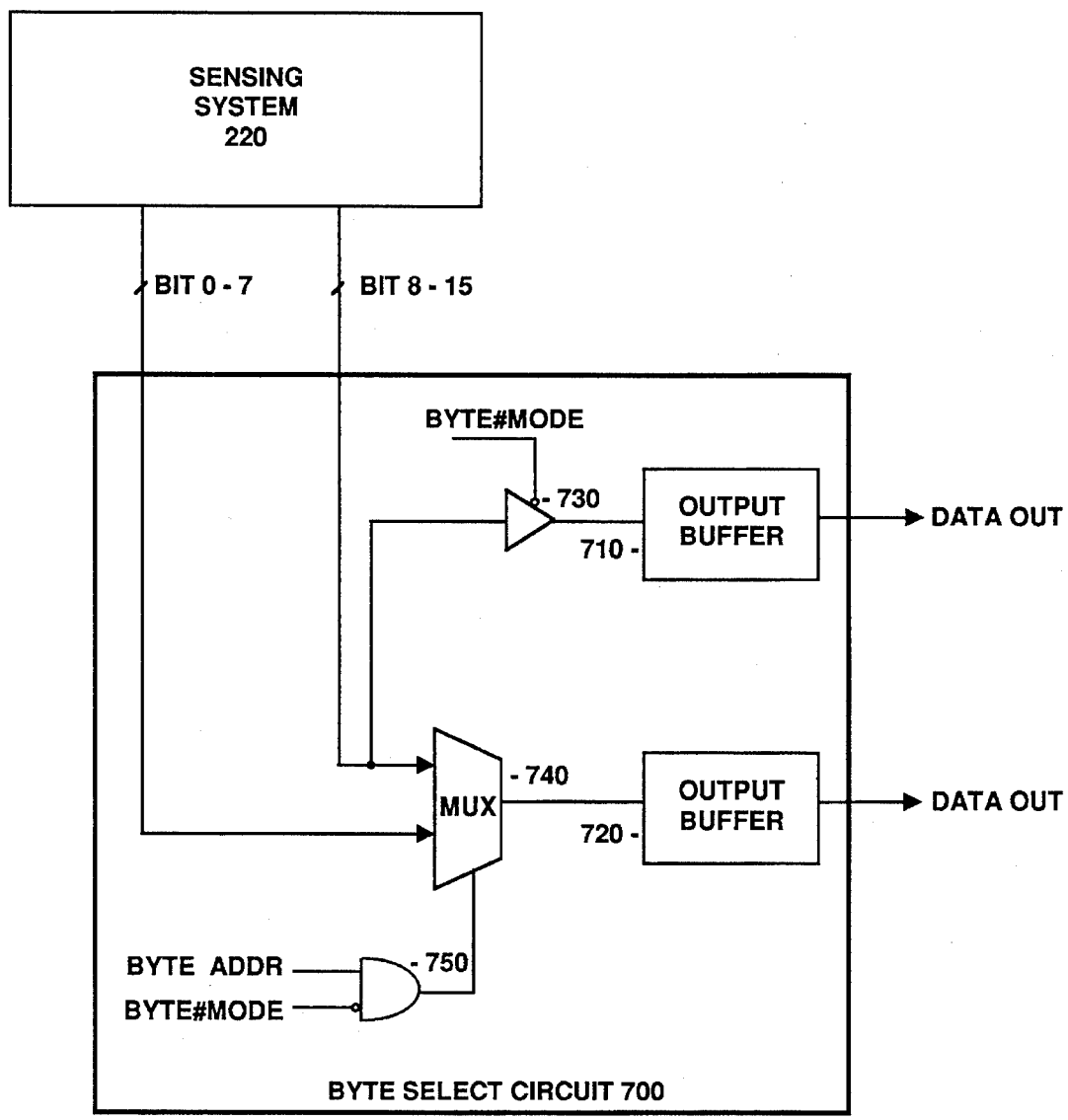
FIG. 7 illustrates a byte select circuit configured in accordance with one embodiment of the present invention.

FIG. 7 illustrates a byte select circuit configured in accordance with one embodiment of the present invention. For the embodiment illustrated in FIG. 7, the byte select circuit 700 receives 16 bits from the sensing system 220. Specifically, the byte select circuit 700 receives, as inputs, the low byte ($BITS_{0-7}$) and high byte ($BITS_{8-15}$) from the sensing system 220, and generates, as outputs, "Data Out" as either a 16 bit word or a selected byte within the 16 bit word. The byte select circuit 700 contains a multiplexer (MUX) 740 that receives the $BITS_{0-7}$ and the $BITS_{8-15}$, and an AND gate 750. The AND gate 750 receives a byte addr (AO) and a Byte# mode signal, and the output controls the select for the MUX 740.

The byte select circuit 700 also contains a buffer 730 coupled to receive the $BITS_{8-15}$ and enabled by the Byte# mode signal. The output of the MUX 740 is input to an output buffer 720, and the output of the buffer 730 is input to an output buffer 710. In operation, when the byte# mode signal is a high logic level, indicating the memory 150 is not in the byte mode, then the MUX 740 selects $BITS_{0-7}$ for input to the output buffer 720, and the $BITS_{8-15}$ are input to the output buffer 710. When the byte# mode signal is a low logic level, indicating the memory 150 is operating in the byte mode, then the MUX 740 selects the either $BITS_{0-7}$ or $BITS_{8-15}$ based on the state of the byte addr.

In one embodiment, a command architecture for programming and erasing the memory cells is utilized. Programming and erasing also involves verifying that the cells have been properly programmed and erased, respectively. The command state machine 110 is coupled to accept instructions from the microprocessor 100. In general, instructions written into the command state machine 110 provide the necessary commands to generate control signals for erasing and programming the memory as well as verifying the contents after the erase and program operations have been executed. Operating in conjunction with the command state machine 110, the control engine 140 programs the selected memory cells according to a "desired data" bit pattern.

In one embodiment, a program sequence includes setting up a program/verify command, loading addresses to the memory 150, and programming the selected memory cells. An erase sequence consists of writing an erase/verify command, and executing the erasure during an erase cycle. In order to verify the erasure, the erase verify operation is executed during a read cycle.

Figure 8:
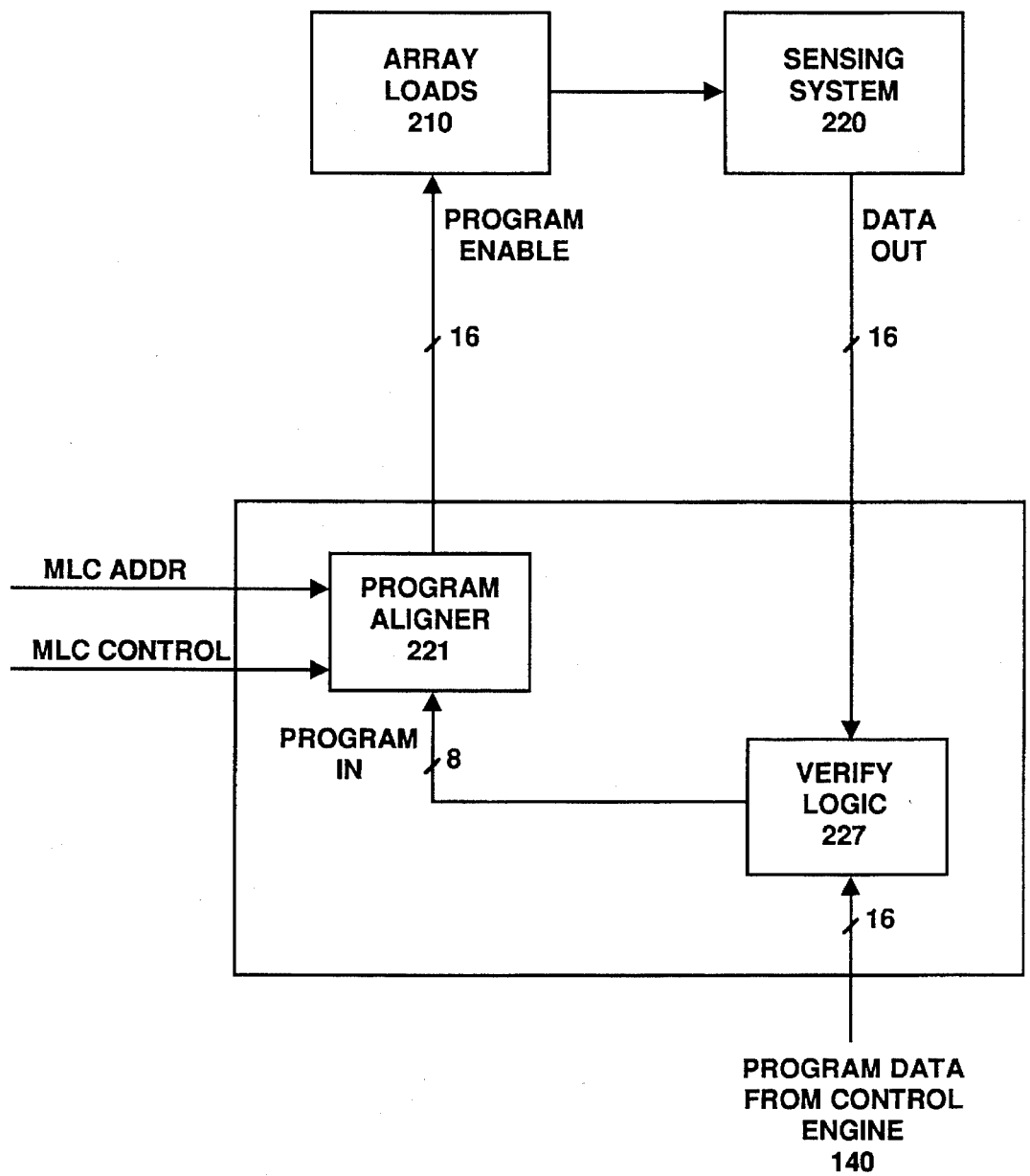
FIG. 8 is a high level block diagram illustrating a program/verify and erase/verify system configured in accordance with one embodiment of the addressing scheme.

FIG. 8 is a high level block diagram illustrating the program/verify and erase/verify system configured in accordance with one embodiment of the addressing scheme. The program circuit 242 contains verify logic 227 and program aligner 221. FIG. 8 illustrates programming of sixteen bits for each wordline. However, any number of memory cells may be used without deviating from the spirit and scope of the invention. In order to program memory cells in the memory array 200, the control engine 140 stores program data for programming. When operating in the MLC mode, the program aligner 221 selects only a portion of the cells identified by the address for programming.

In operation, verify logic 227 receives "data out", from the sensing system 220, and generates "program in" data to indicate which cells in the memory array 200 require additional programming. For example, for a memory system that senses 16 bits simultaneously, the output of the sensing system 220 is a 16 bit word. When operating in the MLC mode, the verify logic 227 generates 8 bits of "program in" data to identify which cells, that store the 16 bit word, require additional programming. When operating in the standard cell mode, the verify logic 227 generates 16 bits of "program in" data corresponding to the 16 bits selected (not shown). When operating in the standard cell mode, the program aligner 221 directly passes the "program in" data as the "program enable" data.

In order to select the proper 8 cells for programming in the MLC mode, the programming aligner 221 receives the MLC addr. Based on the MLC addr, the program aligner 221 outputs 16 bits of "program enable" data to enable programming of the selected 8 memory cells. As discussed above, when operating in the MLC mode, either the even output lines or the odd output lines are selected. For example, if the even cells are selected, then the program aligner 221 generates program enable data that enables only the "even" memory cells that require additional programming.

The verify logic 227 incorporates a compare function. In the standard cell mode, the verify logic 227 performs a single bit comparison to determine whether a memory cell requires programming to the "0" state. In the MLC mode, the compare function involves an analog comparison of the threshold levels stored in the memory cells with the program data. The verify logic 227 compares the program data with the current data sensed from the sensing system 220, and determines whether the memory cells require additional programming. Table 5 illustrates the analog comparison function for MLC mode operation configured in accordance with the threshold levels disclosed in Table 1. As shown in Table 1, the level 0, the highest level, corresponds to bits "00", and the level 3, the lowest level, corresponds to bits "11". A "1" output indicates that the memory cell requires additional programming. For example, to program bits "00" in a single cell that currently stores bits "10", the verify logic 227 outputs a 1 "program in" data bit. The 1 "program in" data bit indicates that the memory cell requires additional programming to go from level 1 to level 0.

TABLE 5

| "Program" | "Current" | "Output" |
|---|---|---|
| 00 | 00 | 0 |
| 00 | 01 | 1 |
| 00 | 10 | 1 |
| 00 | 11 | 1 |
| 01 | 00 | 0 |
| 01 | 01 | 0 |
| 01 | 10 | 1 |
| 01 | 11 | 1 |
| 10 | 00 | 0 |
| 10 | 01 | 1 |
| 10 | 10 | 0 |
| 10 | 11 | 1 |
| 11 | 00 | 0 |
| 11 | 01 | 0 |
| 11 | 10 | 0 |
| 11 | 11 | 0 |

The program aligner 221 receives the 8 "program in" bits from the verify logic 227, and generates the 16 "program enable" data based on the MLC addr. Table 6 illustrates a truth table for the program aligner circuit 221. A "1" program enable indicates that the corresponding output line is enabled for programming.

TABLE 6

| MLC ADDR | Program In | Program Enable (even) | Program Enable (odd) |
|---|---|---|---|
| 0 | 0 | 0 | 0 |
| 0 | 1 | 1 | 0 |
| 1 | 0 | 0 | 0 |
| 1 | 1 | 0 | 1 |

The "program enable" data from the program aligner 221 is input to the select circuit 216 for each pair of output lines in the memory system. As shown in FIG. 6, in order to program the memory cells, each select circuit 216 contains transistors 510 and 520. In one embodiment, the transistors are implemented with n-channel FET devices. The transistor 520 couples the programming voltage, $V_{pp}$, to the even output line, and the transistor 510 couples the programming voltage $V_{pp}$ to the odd output line. The program enable$_{(even)}$ signal controls the gate of transistor 520, and the program enable$_{(odd)}$ signal controls the gate of transistor 510. In operation, when a high logic level appears on either program enable$_{(even)}$ or program enable$_{(odd)}$, then the programming voltage $V_{pp}$ is coupled to the corresponding output line permitting additional programming to occur on the selected cell.

Although the present invention has been described in terms of specific exemplary embodiments, it will be appreciated that various modifications and alterations might be made by those skilled in the art without departing from the spirit and scope of the invention as set forth in the following claims.

What is claimed is:

1. A memory system comprising:
   a plurality of memory cells for storing one of a plurality of threshold levels in said memory cells, wherein said threshold levels demarcate $2^n$ number of windows for designating states to represent storage of "n" bits of data for said memory cells; and
   an address buffer coupled to said memory cells for generating a plurality of physical addresses such that each physical address uniquely identifies a memory location for "j" number of said memory cells, wherein said memory system exhibits a n:1 correspondence between memory locations and said physical addresses, and for generating at least one multi-level cell (MLC) address to identify a portion of said "n" bits of data within said "j" memory cells identified by each physical address.

2. The memory system as set forth in claim 1, further comprising:
   a program controller including a command interface for receiving commands to operate said memory system; and
   a multi-level cell (MLC) address register coupled to said program controller for receiving said MLC address via a command.

3. The memory system as set forth in claim 1, further comprising at least one input pin for receiving said MLC address.

4. The memory system as set forth in claim 1, wherein said physical address comprises:
   a block address for identifying "i" blocks;
   a row address for identifying "k" rows; and
   a column address for identifying "m" columns.

5. The memory system as set forth in claim 1, wherein said "j" number of said memory cells for each physical address comprises 16, such that a word of 16 bits are identified for each physical address when operating in the standard cell mode, and (n*16) bits are identified for each physical address when operating in the MLC mode.

6. The memory system as set forth in claim 5, wherein said physical address comprises a byte address for selecting a high byte or low byte within said 16 bits identified for each physical address.

7. The memory system as set forth in claim 1, wherein said memory cells comprise flash electrically erasable programmable read only memory (EEPROM) cells.

8. The memory system as set forth in claim 1, further comprising:

a program controller including a command interface for receiving commands to operate said memory system;

a multi-level cell (MLC) address register coupled to said program controller for receiving said MLC address via a command for write operations; and an input pin for receiving said MLC address for read operations.

9. The memory system as set forth in claim 8, wherein said address buffer generates a plurality of physical addresses to uniquely identify "j" contiguous memory cells, wherein said memory system maintains address coherency between operation in said MLC mode and said standard cell mode.

10. The memory system as set forth in claim 1, further comprising:

a switch control for permitting selection of an operating mode for said memory system including at least one multi-level cell (MLC) mode and a standard cell mode, wherein said MLC mode specifies storing more than a single bit of data for each memory cell and said standard cell mode specifies storing a single bit of data for each memory cell; and a select circuit coupled to said switch control and said memory cells for reading a single bit per cell when said switch control indicates selection of said standard cell mode, and for reading multiple bits of data per memory cell when said switch control indicates selection of said multi-level cell mode, wherein said memory system maintains address coherency by exhibiting a n:1 correspondence between memory locations and said physical addresses when operating in the MLC mode, and by exhibiting a 1:1 correspondence between memory locations and said physical addresses when operating in the standard cell mode.

11. The memory system as set forth in claim 10, further comprising a program controller coupled to said switch control for programming control structure data in said standard cell mode, and for programming data structures in said MLC mode.

12. The memory system as set forth in claim 1, wherein said threshold levels demarcate four windows for designating four states to represent storage of two bits per memory cell.

13. The memory system as set forth in claim 12, wherein said MLC address comprises a single bit to identify "j/2" number of said memory cells.

14. A method for data storage, said method comprising the steps of:

storing one of a plurality of threshold levels in a plurality of memory cells, wherein said threshold levels demarcate $2^n$ number of windows for designating states to represent storage of "n" bits of data for said memory cells;

generating a plurality of physical addresses such that each physical address uniquely identifies a memory location for "j" number of said memory cells, wherein said memory system exhibits a n:1 correspondence between memory locations and said physical addresses; and generating at least one multi-level cell (MLC) address to identify a portion of said "n" bits of data within said "j" memory cells identified by each physical address.

15. The method as set forth in claim 14, further comprising:

receiving commands via a command interface to operate said memory system; and receiving said MLC address via a command in a multi-level cell (MLC) address register.

16. The method as set forth in claim 14, further comprising the step of receiving said MLC address via an input pin.

17. The method as set forth in claim 14, further comprising the steps of:

receiving commands via a command interface to operate said memory system;

receiving said MLC address via a command in a multi-level cell (MLC) address register for a write operation; and receiving said MLC address via an input pin for a read operation.

18. The method as set forth in claim 14, wherein said threshold levels demarcate four windows for designating four states to represent storage of two bits per memory cell.

19. The method as set forth in claim 14, wherein said MLC address comprises a single bit to identify "j/2" number of said memory cells.

20. The method as set forth in claim 19, wherein the step of generating a plurality of physical addresses comprises the step of:

generating a block address for identifying "i" blocks;

generating a row address for identifying "k" rows; and generating a column address for identifying "m" columns.

21. The method as set forth in claim 14, further comprising the steps of:

selecting an operating mode for said memory system including at least one multi-level cell (MLC) mode and a standard cell mode, wherein said MLC mode specifies storing more than a single bit of data for each memory cell and said standard cell mode specifies storing a single bit of data for each memory cell;

generating physical addresses for accessing a single bit per cell when operating in said standard cell mode to exhibit a 1:1 correspondence between memory locations and said physical addresses; and generating physical addresses including said MLC address for accessing multiple bits of data per memory cell when operating in said multi-level cell mode to exhibit a n:1 correspondence between memory locations and said physical addresses.

22. The method as set forth in claim 21, further comprising the steps of:

programming control structure data in said standard cell mode; and programming data structures in said MLC mode.

23. The method as set forth in claim 21, wherein:

the step of generating physical addresses for accessing a single bit per cell when operating in said standard cell mode comprises the step of generating physical addresses for accessing "j" contiguous memory cells; and the step of generating physical addresses for accessing multiple bits of data per memory cell when operating in said multi-level cell mode comprises the step of generating physical addresses for accessing "j" contiguous memory cells, wherein address coherency is maintained between operation in said MLC mode and said standard cell mode.

24. The method as set forth in claim 14, wherein said memory cells comprise flash electrically erasable programmable read only memory (EEPROM) cells.

25. The method as set forth in claim 14, wherein said "j" number of said memory cells for each physical address comprises 16, such that a word of 16 bits are identified for each physical address when operating in the standard cell mode, and (n*16) bits are identified for each physical address when operating in the MLC mode.

26. The method as set forth in claim 25, wherein the step of generating a plurality of physical addresses comprises the step of generating a byte address for selecting a high byte or low byte within said 16 bits identified for each physical address.

* * * * *

UNITED STATES PATENT AND TRADEMARK OFFICE
CERTIFICATE OF CORRECTION

| | | |
|---|---|---|
| PATENT NO. | : | 5,515,317 |
| DATED | : | May 7, 1996 |
| INVENTOR(S) | : | Wells et al. |

It is certified that error appears in the above-identified patent and that said Letters Patent is hereby corrected as shown below:

In column 9 at line 67 delete "20" and insert --320--

In column 12 at line 15 delete "(AO)" and insert --(A0)--

Signed and Sealed this

Third Day of June, 1997

Attest:

BRUCE LEHMAN

*Attesting Officer*      *Commissioner of Patents and Trademarks*